(12) United States Patent
Lo

(10) Patent No.: US 9,125,306 B2
(45) Date of Patent: Sep. 1, 2015

(54) FLEXIBLE PRINTED CIRCUIT BOARD AND COMBINATION THEREOF

(71) Applicant: Lintes Technology Co., Ltd, New Taipei (TW)

(72) Inventor: Wei-Zen Lo, New Taipei (TW)

(73) Assignee: LINTES TECHNOLOGY CO., LTD, New Taipei (TW)

( * ) Notice: Subject to any disclaimer, the term of this patent is extended or adjusted under 35 U.S.C. 154(b) by 218 days.

(21) Appl. No.: 13/717,374

(22) Filed: Dec. 17, 2012

(65) Prior Publication Data

US 2013/0155632 A1  Jun. 20, 2013

Related U.S. Application Data

(60) Provisional application No. 61/577,561, filed on Dec. 19, 2011.

(51) Int. Cl.
*H05K 1/02* (2006.01)
*H05K 1/14* (2006.01)

(52) U.S. Cl.
CPC .............. *H05K 1/028* (2013.01); *H05K 1/147* (2013.01); *H05K 1/144* (2013.01); *H05K 2201/055* (2013.01)

(58) Field of Classification Search
CPC .. H05K 2201/055; H05K 1/028; H05K 1/147
USPC ......................................................... 361/749
See application file for complete search history.

(56) References Cited

U.S. PATENT DOCUMENTS

| | | | | |
|---|---|---|---|---|
| 5,428,187 A | * | 6/1995 | Crane et al. ...................... | 174/36 |
| 5,917,158 A | * | 6/1999 | Takao et al. ................... | 174/254 |
| 6,969,806 B2 | * | 11/2005 | Dupriest .................... | 174/117 F |
| 7,258,423 B2 | * | 8/2007 | Nakamura ....................... | 347/50 |
| 7,757,394 B2 | * | 7/2010 | Watanabe ....................... | 29/852 |
| 7,874,642 B2 | * | 1/2011 | Kobayashi ....................... | 347/50 |
| 8,530,747 B2 | * | 9/2013 | Kim ............................. | 174/254 |

* cited by examiner

*Primary Examiner* — William H Mayo, III
*Assistant Examiner* — Hiram E Gonzalez
(74) *Attorney, Agent, or Firm* — Locke Lord LLP; Tim Tingkang Xia, Esq.

(57) ABSTRACT

A flexible printed circuit board for connecting external modules, includes a high-frequency signal wiring board and a low-frequency signal wiring board. Side edges of the high-frequency signal wiring board and the low-frequency signal wiring board are connected to each other. The low-frequency signal wiring board is folded toward the high-frequency signal wiring board to form a stacked double-layer board structure. Each of two ends of the high-frequency signal wiring board extends to form a connecting board for connecting the external module. A flexible printed circuit board combination includes two flexible printed circuit boards.

8 Claims, 5 Drawing Sheets

FLEXIBLE PRINTED CIRCUIT BOARD AND COMBINATION THEREOF

CROSS-REFERENCE TO RELATED APPLICATION

This non-provisional application claims priority to and the benefit of, pursuant to 35 U.S.C. §119(e), U.S. Provisional Patent Application No. 61/577,561, filed on Dec. 19, 2011, entitled "A FLEXIBLE CABLE", by Wei Zen Lo, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to a flexible printed circuit board, and more particularly to a flexible printed circuit board and a combination thereof for connecting two high-frequency transmission modules.

BACKGROUND OF THE INVENTION

Nowadays, with the rapid development of high-speed transmission technologies, increasingly higher requirements are imposed on the design of high-frequency signal transmission lines. A conventional high-frequency signal transmission line generally adopts a coaxial cable. When a large number of signals need to be transmitted, many coaxial cables need to be bundled together. However, in a device with limited wiring space, the cables often need to be bent. In this case, the coaxial cables that are bundled together do not have desirable flexibility, making it inconvenient for line installation. In addition, when a cable is used to connect two signal transmission modules, wires at two ends of the cable must be soldered to corresponding contacts. However, since the coaxial cables are bundled together and manual cabling is required, automated production cannot be achieved, resulting in a low production efficiency.

For the above reasons, it has been proposed in the related art to replace the coaxial cables with a flexible printed circuit board so as to solve the above problems. However, provided that the wiring area is constant, when the number of signal lines is increased, in order to achieve an anti-electromagnetic interference effect close to that of the coaxial cables, more than three wiring layers need to be disposed on the flexible printed circuit board and high-frequency lines of different layers need to be staggered, so that high-frequency transmission lines of different layers do not interfere with each other. It is known to those skilled in the art that the larger the number of wiring layers in a circuit board is, the more complex the manufacturing process is, and the higher the cost will be.

Therefore, a heretofore unaddressed need exists in the art to address the aforementioned deficiencies and inadequacies.

SUMMARY OF THE INVENTION

In one aspect, the present invention is directed to a flexible printed circuit board that has good flexibility, meets anti-electromagnetic interference requirements, and has a low cost.

In one embodiment, a flexible printed circuit board according to the present invention includes a high-frequency signal wiring board and a low-frequency signal wiring board. Side edges of the high-frequency and the low-frequency signal wiring boards are connected to each other, and the low-frequency signal wiring board is folded toward the high-frequency signal wiring board to form a stacked double-layer board structure. Each of two ends of the high-frequency signal wiring board extends to form a connecting board for connecting an external module.

Compared with the related art, among other things, the flexible printed circuit board according to the present invention is folded to form a stacked double-layer board structure, so as to simulate a flexible printed circuit board with multi-layer wiring, and therefore can conveniently multiply the number of layers in the circuit board and meet the anti-electromagnetic interference requirements without requiring a complex manufacturing process, thereby greatly reducing the manufacturing cost.

In another aspect, the present invention is directed to a flexible printed circuit board combination which has good flexibility, meets anti-electromagnetic interference requirements, and has a low cost.

In one embodiment, a flexible printed circuit board combination according to the present invention includes two identical flexible printed circuit boards. Each flexible printed circuit board has a connecting region at each of two ends thereof. A plurality of high-frequency signal contacts and a plurality of low-frequency signal contacts are provided on the connecting region. A high-frequency signal wiring region is located between the two connecting regions and connected to the two connecting regions. The high-frequency signal wiring region is provided with a plurality of high-frequency signal traces respectively correspondingly electrically connected to the high-frequency signal contacts on the two connecting regions. A low-frequency signal wiring region is located between the two connecting regions and adjacent to the high-frequency signal wiring region. The low-frequency signal wiring region is provided with a plurality of low-frequency signal traces respectively correspondingly electrically connected to the low-frequency signal contacts on the two connecting regions. A notch is formed in the low-frequency signal wiring region. The corresponding two notches on the two flexible printed circuit boards are interlocked, and the low-frequency signal wiring region of each of the flexible printed circuit boards corresponds to the high-frequency signal wiring region of the other flexible printed circuit board.

Compared with the related art, among other things, in the flexible printed circuit board combination according to the present invention, the corresponding two notches on the two flexible printed circuit boards are interlocked, so that the two flexible printed circuit boards can be arranged reversely, and therefore the high-frequency signal traces respectively located on the two flexible printed circuit boards are staggered from one another, which greatly reduces mutual electromagnetic interference, achieves a good anti-electromagnetic interference effect and requires a simpler manufacturing process than the flexible printed circuit board with multi-layer wiring, thereby reducing the manufacturing cost while ensuring the performance.

In a further aspect, the present invention is directed to a flexible printed circuit board, which not only can be folded to form a structure simulating a flexible printed circuit board with multi-layer wiring, but can also be combined with another identical flexible printed circuit board to form a structure simulating a flexible printed circuit board with multi-layer wiring.

In one embodiment, a flexible printed circuit board according to the present invention includes a high-frequency signal wiring board and a low-frequency signal wiring board. Side edges of the high-frequency signal wiring board and the low-frequency signal wiring board are connected to each other. Each of two ends of the high-frequency signal wiring board in a length direction extends to form a connecting board for connecting an external module, each of the connecting boards extends toward the low-frequency signal wiring board, and a notch is formed between each of the connecting boards and the low-frequency signal wiring board.

Compared with the related art, among other things, the flexible printed circuit board according to the present invention can be folded, and two identical flexible printed circuit boards having the notch can be interlocked to form a double-layer board to simulate a flexible printed circuit board with multi-layer wiring. Therefore, the present invention has a simple structure, is convenient to use and can reduce the manufacturing cost while meeting the anti-electromagnetic interference requirements.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
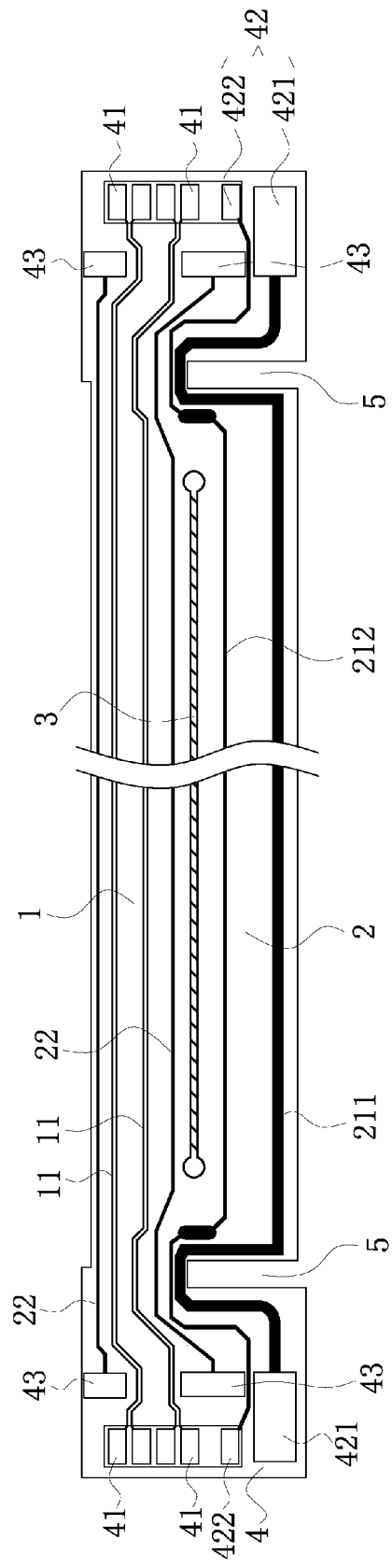
FIG. 1 is a schematic plan view of line distribution of a flexible printed circuit board according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

A flexible printed circuit board 100 and a combination thereof according to the present invention are further described in detail below with reference to the accompanying drawings and specific embodiments. To highlight the features according to the present invention and for the brevity of drawings, conventional structures such as the outermost insulating layer of the flexible printed circuit board 100 are omitted in the accompanying drawings according to the present invention.

Figure 2:
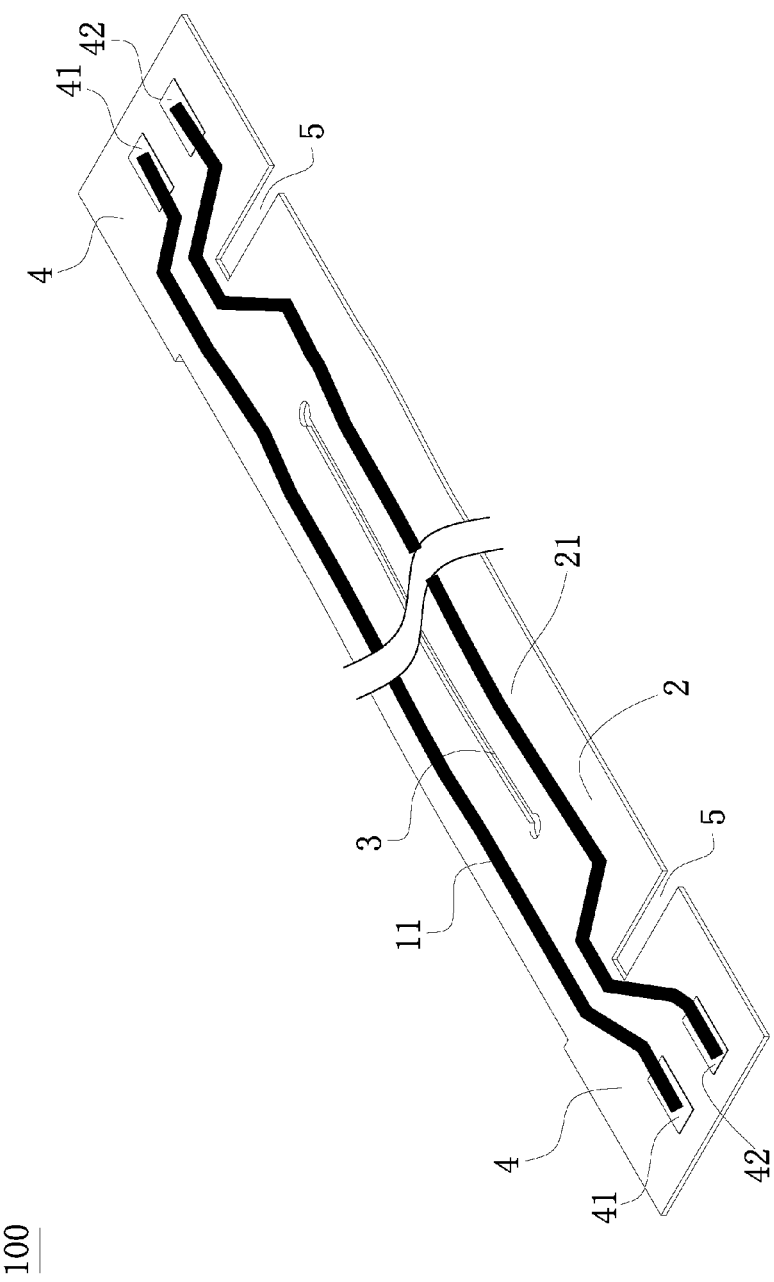
FIG. 2 is a simplified schematic three-dimensional view of the line of FIG. 1.
Figure 3:
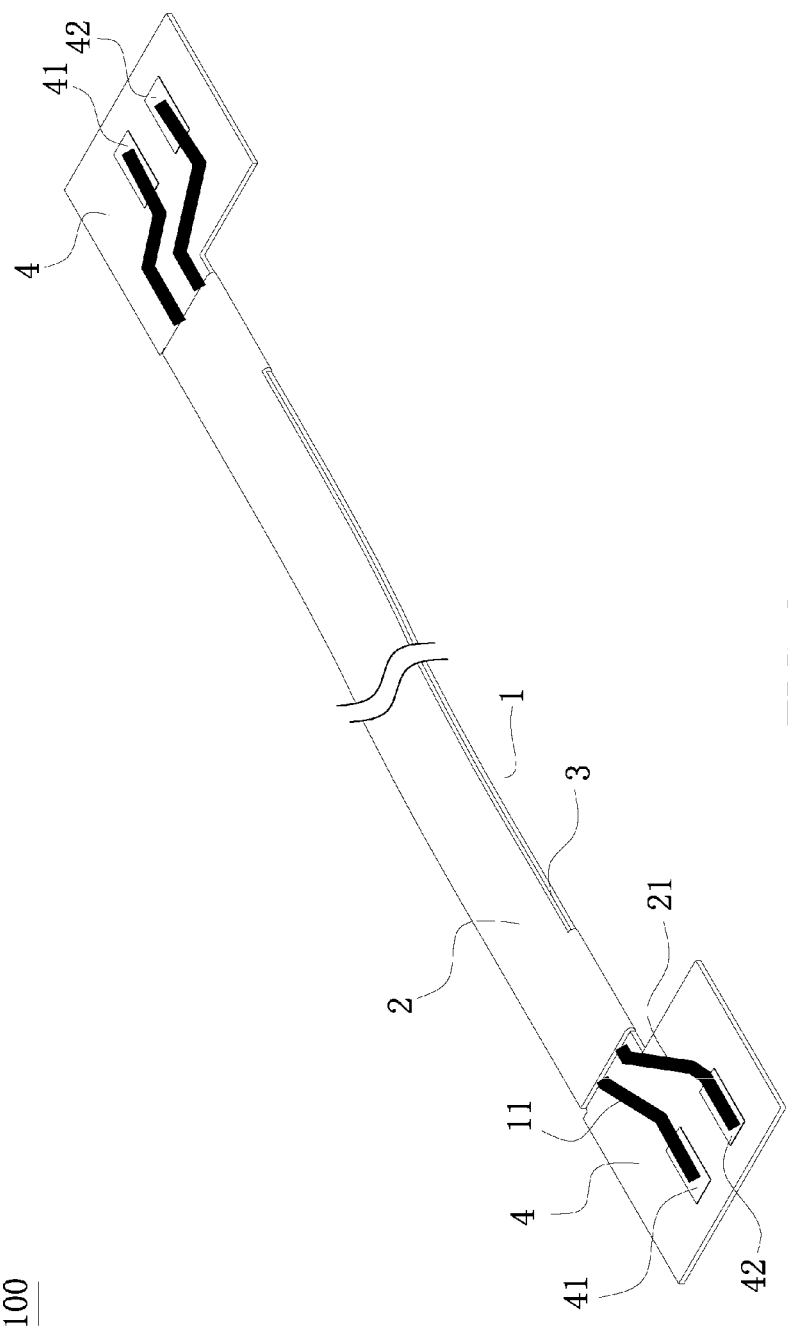
FIG. 3 is schematic three-dimensional view according to one embodiment of the present invention.

FIGS. 1 to 3 show a first embodiment of the flexible printed circuit board 100 according to the present invention. The flexible printed circuit board 100 includes a high-frequency signal wiring board 1 and a low-frequency signal wiring board 2. Side edges of the high-frequency signal wiring board 1 and the low-frequency signal wiring board 2 are connected to each other. A lengthwise extending groove 3 is formed at the junction between the high-frequency signal wiring board 1 and the low-frequency signal wiring board 2. The groove 3 is formed through the flexible printed circuit board 100 in this embodiment, but also may not be formed through the flexible printed circuit board 100 in other embodiments. Each of two ends of the high-frequency signal wiring board 1 in a length direction extends to form a connecting board 4 for connecting an external module (not shown). Each of the connecting boards 4 extends toward the low-frequency signal wiring board 2. A notch 5 is formed between each of the connecting boards 4 and the low-frequency signal wiring board 2.

As shown in FIG. 1, each of the connecting boards 4 is provided with a connecting region for interconnection with the external module (not shown), and a plurality of high-frequency signal contacts 41 and a plurality of low-frequency signal contacts 42 are distributed on the connecting region. The high-frequency signal wiring board 1 is provided with a plurality of high-frequency signal traces 11 correspondingly connected to the high-frequency signal contacts 41 on the two connecting boards 4. The high-frequency signal traces 11 are concentrated in the high-frequency signal wiring region on the high-frequency signal wiring board 1. As shown in FIGS. 1 and 2, the low-frequency signal wiring board 2 has a low-frequency signal wiring region, which is provided with a plurality of low-frequency signal traces 21 correspondingly connected to the low-frequency signal contacts 42 on the two connecting boards 4. For reasonable distribution of the signal traces, a part of the low-frequency signal traces 21 are bent to bypass the notch 5 and pass through the high-frequency signal wiring board 1.

The low-frequency signal contacts 42 on each of the connecting boards 4 include a power supply contact and two optical signal contacts 43. Herein, the so-called optical signal does not refer to real light, but in fact, a circuit is used to replace an optical fiber. That is, an electric signal is used as an equivalent signal of light. Therefore, the so-called optical signal also belongs to low-frequency signals. Correspondingly, the low-frequency signal traces 21 include a power supply trace connected to the power supply contact and optical signal traces 22 connected to the optical signal contacts 43. The power supply trace partially passes through the high-frequency signal wiring board 1. The power supply contacts include a high power supply contact 421 for high-speed transmission and a low power supply contact 422 for low-speed transmission. The power supply traces include a high power supply trace 211 and a low power supply trace 212. In this embodiment, for the purpose of reasonable wiring, there are two optical signal traces 22, both of which are disposed on the high-frequency signal wiring board 1. Alternatively, in other embodiments (not shown), only one optical signal trace 22 may be used to connect the two optical signal contacts 43. In another embodiment, there may be only one optical signal contact 43. In one embodiment, the flexible printed circuit board 100 is designed into a double-layer wiring structure, with the optical signal traces 22 and the high-frequency signal traces 11 being located in different wiring layers respectively to avoid intersection. Alternatively, the optical signal traces 22 may be disposed in the same manner as the power supply trace.

As shown in FIG. 3, the low-frequency signal wiring board 2 is folded along the groove 3 toward the high-frequency signal wiring board 1 to form a stacked double-layer board structure, so as to simulate a flexible printed circuit board 100 with multi-layer wiring, thereby achieving a good anti-electromagnetic interference effect. Since the high-frequency signal traces 11 are concentrated on the high-frequency signal wiring board 1, the high-frequency signal traces 11 will not be folded, so that unexpected change in impedance is prevented, and the impedance value can be conveniently controlled. Although the low-frequency signal traces 21 are folded, since low-frequency signals traces 21 do not have high requirements on the impedance value, the change in impedance caused by folding may be ignored. Since the groove 3 is preset at the folded position, breakage of the flexible printed circuit board 100 when being folded is prevented. In this embodiment, the groove 3 is strip-shaped. Alternatively, in other embodiments (not shown), a plurality of small grooves 3 may be formed.

Figure 4:
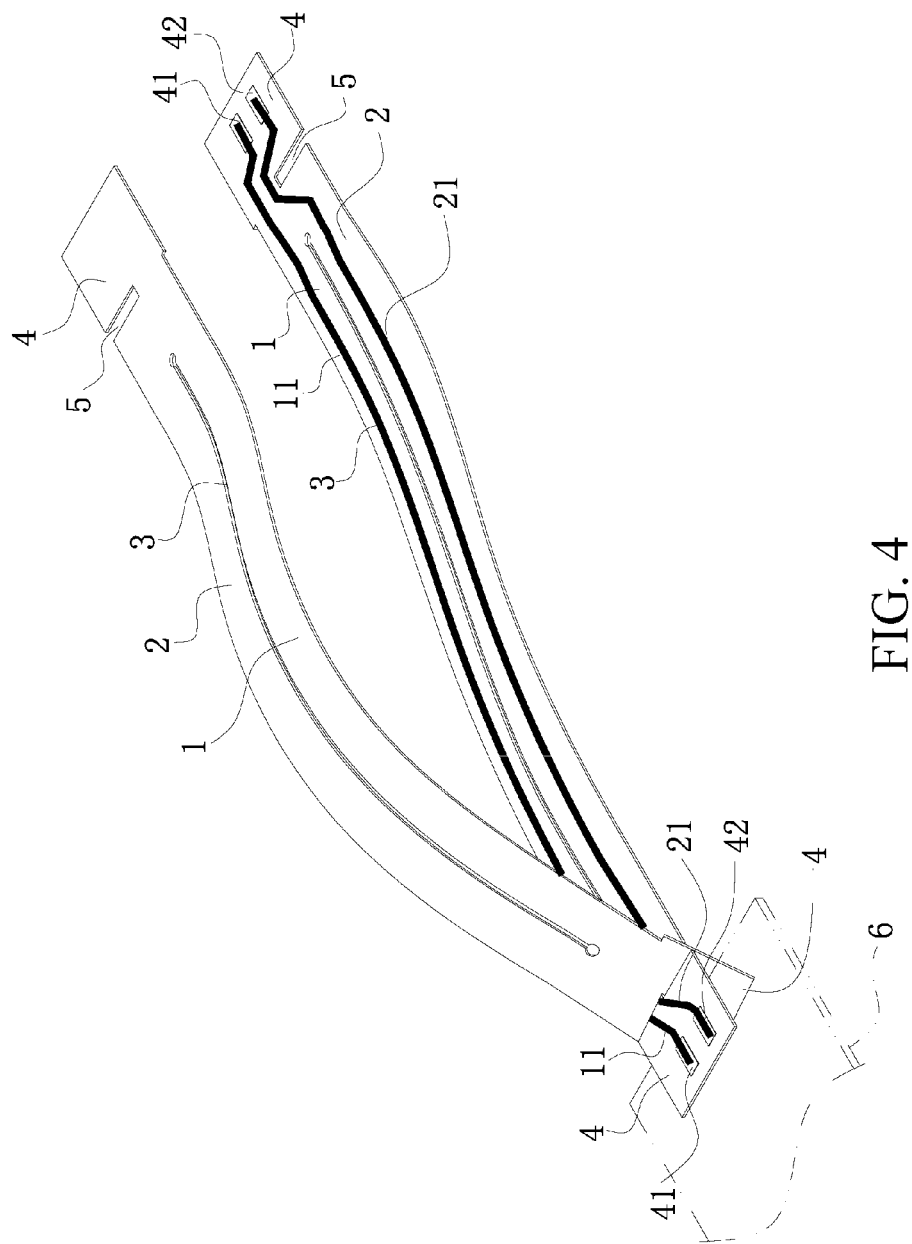
FIG. 4 is schematic three-dimensional view according to a second embodiment of the present invention.

FIG. 4 shows a second embodiment according to the present invention. In this embodiment, two flexible printed circuit boards 100 as shown in FIG. 2 are used, and the corresponding two notches 5 formed on the two flexible printed circuit boards 100 are interlocked, so as to form a double-layer board structure. In addition, through interlocking of the notches 5, the two connecting boards 4 of each of the flexible printed circuit boards 100 are respectively located on top and bottom surfaces of a first external module 6 and a second external module (not shown). In this embodiment, the corresponding signal contacts are respectively provided on the two connecting boards 4, so that cross connection can be achieved. Moreover, since the two flexible printed circuit boards 100 are oriented in reverse directions after interlocking so that the low-frequency signal wiring board 2 of one flexible printed circuit board corresponds to the high-frequency signal wiring board 1 of the other flexible printed circuit board and the high-frequency signal wiring boards 1 on the two flexible printed circuit boards 100 are staggered from each other, mutual electromagnetic interference is reduced greatly, a good anti-electromagnetic interference effect is achieved, and stable transmission of high-frequency signals is ensured.

Figure 5:
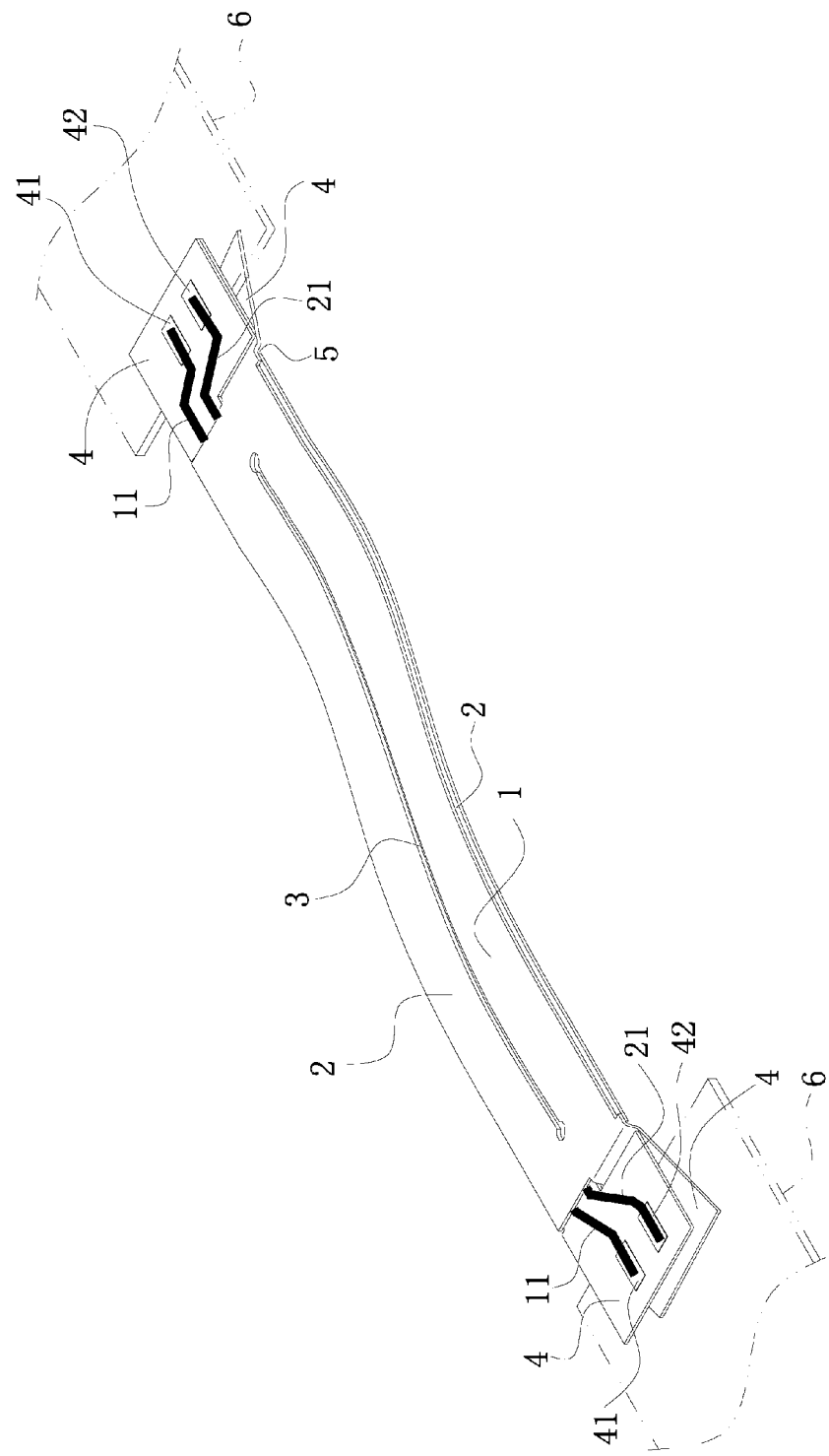
FIG. 5 is schematic three-dimensional view according to a third embodiment of the present invention.

FIG. 5 shows a third embodiment according to the present invention. Different from the second embodiment, in this embodiment, all the notches 5 corresponding to each other are interlocked, forming a close fit between the two flexible printed circuit boards 100. Alternatively, in other embodiments (not shown), more notches 5 may be provided, making it easier to fold the low-frequency signal wiring board 2, and achieving more stable interlocking of the two flexible printed circuit boards 100.

It is to be understood by those of ordinary skill in the art that the signal contacts may be disposed on the top surface or bottom surface of the connecting board depending on different application occasions. For example, when being used for cross connection, the corresponding signal contacts should be respectively located on the top surface of the connecting board 4 at one end of the flexible printed circuit board 100 and the bottom surface of the connecting board 4 at the other end of the flexible printed circuit board 100. Alternatively, in order to ensure applicability and compatibility to the maximum extent, the signal contacts may be directly disposed on the top and bottom surfaces of the connecting board 4.

Based on the above, the flexible printed circuit board 100 and combination thereof according to the embodiments according to the present invention, among other things, has the following advantages.

1. The flexible printed circuit board 100 according to the present invention is folded to form a stacked double-layer board structure, so as to simulate a flexible printed circuit board with multi-layer wiring, and therefore can conveniently multiply the number of layers in the circuit board and meet the anti-electromagnetic interference requirements without requiring a complex manufacturing process, thereby greatly reducing the manufacturing cost.

2. In the flexible printed circuit board 100 combination according to the present invention, the corresponding two notches 5 formed on the two flexible printed circuit boards 100 are interlocked, so that the two flexible printed circuit boards 100 can be arranged reversely, and therefore the high-frequency signal traces 11 respectively located on the two flexible printed circuit boards 100 are staggered from one another, which greatly reduces mutual electromagnetic interference, achieves a good anti-electromagnetic interference effect and requires a simpler manufacturing process than the flexible printed circuit board 100 with multi-layer wiring, thereby reducing the manufacturing cost while ensuring the performance.

3. The flexible printed circuit board 100 according to the present invention can be folded, and two identical flexible printed circuit boards 100 having the notch 5 can be interlocked to form a double-layer board to simulate a flexible printed circuit board with multi-layer wiring. Therefore, the present invention has a simple structure, is convenient to use and can reduce the manufacturing cost while meeting the anti-electromagnetic interference requirements.

4. The groove 3 of the flexible printed circuit board 100 according to the present invention makes it easier to fold the flexible printed circuit board 100, thereby effectively preventing breakage.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A flexible printed circuit board, for connecting external modules, comprising:
   a high-frequency signal wiring board and a low-frequency signal wiring board,
   wherein side edges of the high-frequency signal wiring board and the low-frequency signal wiring board are connected to each other, the low-frequency signal wiring board is folded toward the high-frequency signal wiring board to form a stacked double-layer board structure, and each of two ends of the high-frequency signal wiring board extends to form a connecting board for connecting the external module;

wherein each connecting board at each end of the high-frequency signal wiring board is provided with a plurality of high-frequency signal contacts and a plurality of low-frequency signal contacts;

wherein the high-frequency signal wiring board is provided with a plurality of high-frequency signal traces correspondingly connected to the high-frequency signal contacts on the two connecting boards;

wherein the low-frequency signal wiring board is provided with at least one low-frequency signal trace correspondingly connected to the low-frequency signal contacts on the two connecting boards; and wherein a part of the low-frequency signal trace passes through the high-frequency signal wiring board.

2. The flexible printed circuit board according to claim 1, wherein at least one groove is formed at a folded position of the high-frequency signal wiring board and the low-frequency signal wiring board.

3. The flexible printed circuit board according to claim 1, wherein the low-frequency signal contacts comprise at least one power supply contact and at least one optical signal contact.

4. A flexible printed circuit board combination, comprising:

two flexible printed circuit boards, each having a connecting board at each of two ends thereof, a high-frequency signal wiring board and a low-frequency signal wiring board, wherein the connecting board is provided with a plurality of high-frequency signal contacts and a plurality of low-frequency signal contacts;

wherein the high-frequency signal wiring board and the low-frequency signal wiring board are adjacent to each other and located between the two connecting boards;

wherein the high-frequency signal wiring board is connected to the two connecting boards, and provided with a plurality of high-frequency signal traces respectively electrically connected to the high-frequency signal contacts on the two connecting boards, and a notch is formed between the low-frequency signal wiring board and one of the connecting boards;

wherein the low-frequency signal wiring board is provided with a plurality of low-frequency signal traces respectively electrically connected to the low-frequency signal contacts on the two connecting boards; and wherein the corresponding two notches on the two flexible printed circuit boards are interlocked, and the low-frequency signal wiring board of each of the flexible printed circuit boards is stacked on the high-frequency signal wiring board of the other flexible printed circuit board.

5. The flexible printed circuit board combination according to claim 4, wherein at least one groove is formed at the junction between the high-frequency signal wiring board and the low-frequency signal wiring board.

6. The flexible printed circuit board combination according to claim 5, wherein the two flexible printed circuit boards are identical.

7. A flexible printed circuit board, for connecting external modules, comprising:

a high-frequency signal wiring board and a low-frequency signal wiring board, wherein side edges of the high-frequency signal wiring board and the low-frequency signal wiring board are connected to each other, each of two ends of the high-frequency signal wiring board in a length direction extends to form a connecting board for connecting the external module, each connecting board at each end of the high-frequency signal wiring board extends toward the low-frequency signal wiring board, and a notch is formed between each of the connecting boards and the low-frequency signal wiring board;

wherein each of the connecting boards is provided with a plurality of high-frequency signal contacts and a plurality of low-frequency signal contacts, and the high-frequency signal wiring board is provided with a plurality of high-frequency signal traces correspondingly connected to the high-frequency signal contacts on the two connecting boards; and wherein the low-frequency signal wiring board is provided with at least one low-frequency signal trace correspondingly connected to the low-frequency signal contacts on the two connecting boards, and a part of the low-frequency signal trace bypasses the notch and passes through the high-frequency signal wiring board.

8. The flexible printed circuit board according to claim 7, wherein at least one groove is formed at the junction between the high-frequency signal wiring board and the low-frequency signal wiring board.

* * * * *